United States Patent [19]
Riggio, Jr.

[11] Patent Number: 5,539,306
[45] Date of Patent: Jul. 23, 1996

[54] METHOD AND APPARATUS FOR TESTING ELECTRICAL AND ELECTRONIC CIRCUITS

[75] Inventor: Salvatore R. Riggio, Jr., Boca Raton, Fla.

[73] Assignee: International Business Machines Corporation, Armonk, N.Y.

[21] Appl. No.: 451,966

[22] Filed: May 26, 1995

Related U.S. Application Data

[63] Continuation of Ser. No. 377,547, Jan. 24, 1995.

[51] Int. Cl.⁶ .......................... G01R 31/28; G06F 15/20; G06F 11/00
[52] U.S. Cl. .......................... 324/158.1; 364/578; 371/24
[58] Field of Search ........................ 371/25, 27; 364/483, 364/183, 481, 486, 489, 550, 569, 581, 575, 701, 578

[56] References Cited

U.S. PATENT DOCUMENTS

| | | | |
|---|---|---|---|
| 4,571,724 | 2/1986 | Belmondo et al. | 371/25 |
| 5,329,471 | 1/1994 | Swoboda et al. | 364/578 |

*Primary Examiner*—Kenneth A. Wieder
*Assistant Examiner*—Barry C. Bowser
*Attorney, Agent, or Firm*—Richard A. Tomlin; John C. Black; Barry L. Haley

[57] ABSTRACT

An apparatus is disclosed for quickly testing individual wiring nets in a multi-layer device carrier. A central processing unit (CPU) controls a probe to sequentially engage contact pads on the carrier, each of which is electrically connected to a respective wiring net. The probe connects each wiring net to a network sensitive pulse generator circuit which generates a train of output pulses having a frequency dependent upon the transient behavior of the net under test. The stimulation of the net and the sensing of the net's response operate responsively to a feedback signal, which is also a signature signal. By connecting the net under test to the novel circuit, the combination of the novel circuit and the net under test generates the series of output pulses. The number of pulses generated in a predetermined period of time forms the signature of the net under test. A preferred embodiment is described which uses differential amplifiers to stimulate the net and to sense the net's response. The differential amplifier which senses the net's response is connected to a circuit which produces the feedback/signature signal. The feedback/signal is then provided to the differential amplifiers to adjust their behavior. A novel pulse counting and interface circuit counts each series of output pulses received from the network sensitive pulse generator in a predetermined period of time; and, under control of the CPU, transfers each count to the CPU for evaluation by programs contained therein.

9 Claims, 8 Drawing Sheets

METHOD AND APPARATUS FOR TESTING ELECTRICAL AND ELECTRONIC CIRCUITS

RELATED APPLICATION

The present application is a continuation to an earlier filed, copending application of the inventor herein and assigned to a common assignee. The earlier filed application Ser. No. 08/377,547, filed Jan. 24, 1995, pending, is entitled Network Sensitive Pulse Generator and describes and claims one feature of the improved test apparatus of the present application. The specification and drawings of the earlier filed application are substantially set forth in the present application.

BACKGROUND OF THE INVENTION

1. Field of the Invention

This invention relates to testing an electrical net of an electrical or electronic circuit and, more particularly, to a method of and apparatus for quickly detecting fault conditions in individual wiring nets in a multi-layer device carrier, for example. It also relates to a unique method and means for counting the number of pulses received from any source in a fixed period of time and to an interface which permits coupling to any general purpose computer for software manipulation of the collected test data.

2. Description of the Prior Art

In the electrical arts, the testing of electrical "nets" of an electrical or electronic circuit for fault conditions is universally recognized to be of high importance. Among other things, circuit manufacturers and purchasers want to test nets for "opens," "shorts," and other faulty characteristics, such as circuits having incorrect resistance, inductance, and capacitance characteristics ("RLC" characteristics). The term "net" is known in the art and generally refers to the electrical characteristics of a circuit as they appear from a given circuit node. These electrical characteristics are measured with reference to a predetermined reference point, e.g., ground. A circuit typically includes several nets of interest.

The prior art includes methods that subject the net under test to a sinusoidal input stimulus and then measure both the magnitude and phase of the net's response to the input stimulus. The magnitude and phase may then be analyzed to detect faults in the net. In addition, the prior art includes methods that directly measure the various RLC characteristics of a net to be tested.

Though the prior art methods are generally perceived as capable of detecting many types of faults, they have undesirable shortcomings. Among other things, certain nets, particularly those having large capacitances, require unduly long testing times. This is so, because the prior art methods must use a low frequency stimulus to ensure accurate measurement of a high capacitance. The low frequency results in longer testing times, and the longer testing times, in turn, increase the testing cost. This becomes particularly acute when high volume testing is required.

In addition, many prior art methods require a priori knowledge of the net configuration being tested, including knowledge of the arrangement of various components and their RLC characteristics. This complicates the testing, increases the cost, and in certain instances is entirely impracticable.

Further, many prior art methods are particularly configured to test nets having a relatively limited range of possible RLC characteristics. Consequently, manufacturers and purchasers are required to buy additional testing equipment, if they desire to test nets outside the limited range of their existing testers.

In addition, test equipment is typically designed for control by and operation with a specific computer for acquisition and evaluation of test data.

Accordingly, there is a need in the art for an improved method and apparatus for testing nets quickly.

It is an object of the invention to provide a method and apparatus to detect faults in a net quickly.

It is a further object of the invention to provide a method and apparatus to detect faults in a net without requiring a priori knowledge of the net to be tested.

It is yet a further object of the invention to provide a method and apparatus that can test a variety of nets having a wide range of RLC characteristics.

It is a further object of the invention to provide a method and apparatus which can utilize any general purpose computer and its software for controlling the testing and fault detecting procedures thereof.

SUMMARY OF THE INVENTION

The earlier filed copending application describes a novel network sensitive pulse generator circuit, and, in combination with the apparatus described in the present application, the novel circuit is used to detect faults in a net under test. The novel network sensitive pulse generator is coupled to the net under test, and once coupled, the two form a "super circuit," which acts as an oscillator and generates a pulse train, called a "signature." The generated signature is detected by a novel pulse counter of the present application and then compared with a known good signature in a general purpose computer. Faults are detected by detecting mismatches between the generated signature and the known good signature. This detection may allow for mismatches within a predetermined tolerance.

The net under test is connected to a variable current source which is, in turn, controlled by the pulse generator output of the test circuit. Consequently, the aforementioned output pulse train will affect the current flowing through the net under test. This variable current generates a variable voltage across the net which voltage is sensed and used to control both the binary output and the current source.

A feature of the present invention is a unique method and means for counting the number of pulses of an incoming train of pulses which are received in a fixed period of time from the network sensitive pulse generator circuit. In a preferred embodiment, clock pulses and CPU address and control signals are applied to a programmable array logic (PAL) device to repetitively step the PAL through a sequence of operations. Output control signals from the PAL control a gated counter for counting input pulses during fixed periods of time, control the transfer of pulse counts from the counter to CPU bus interface data latches and control the transfer of selected counts from the data latches to a CPU data bus via tri-state bus drivers.

In a preferred embodiment, the number of pulses counted in a fixed period and then stored in the CPU form a fingerprint of one net of a sensed electronic circuit. These pulse counts of various nets in the circuit are subsequently evaluated by CPU software which has overall control of the test process. The CPU bus interface can be used by any standard programming language to manipulate the recorded data.

In a preferred embodiment, all inputs from the CPU to the digital pulse counter are standard lines found in all CPUs; and all inputs from the digital pulse counter to the CPU are entered by way of a standard CPU data bus. There is no input to the CPU from the pulse counter via a control line input to the CPU.

Consequently, the asynchronous data collection system is compatible with any CPU and its respective software.

The pulse counter of the preferred embodiment also includes a programmable frequency divider and oscillator which permit the fixed counting period to be selected from any one of a number of time periods.

Thus, inexpensive test apparatus is disclosed which:

1. needs no prior knowledge of the net configuration being tested;

2. can test a variety of nets having a wide range of RLC characteristics; and 3. includes a novel pulse counting circuit which is fast and accurate and includes an output interface which permits coupling to any general purpose computer and its software for control of the test procedures.

BRIEF DESCRIPTION OF THE DRAWINGS

The above and further advantages of the invention may be better understood by referring to the following description in conjunction with the accompanying drawings in which.

DESCRIPTION OF THE PREFERRED EMBODIMENTS

Figure 1:
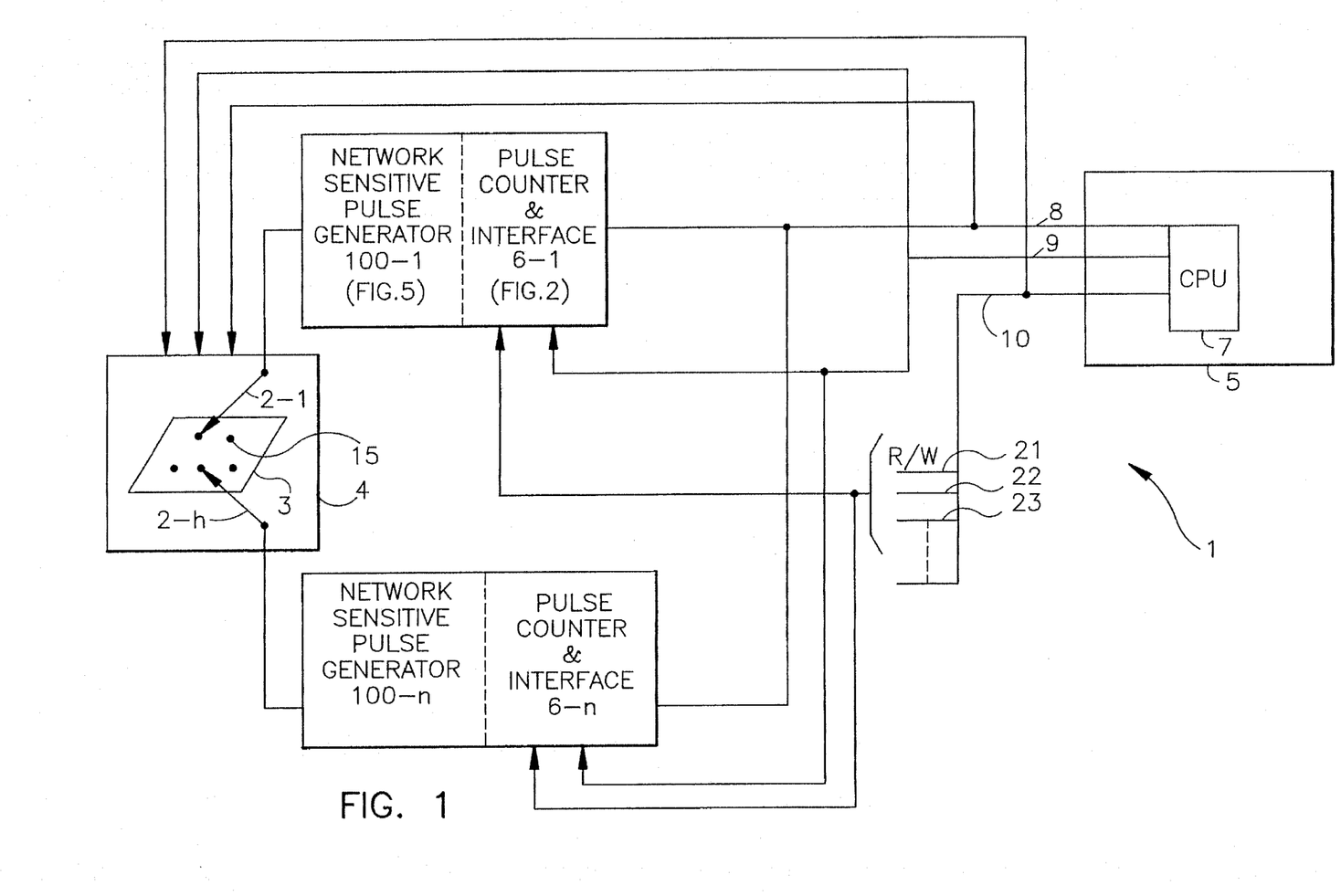
FIG. 1 is a block diagram of the test apparatus including a controlling general purpose computer.

The improved test apparatus 1 of FIG. 1 includes a plurality of probes 2-1 to 2-n adapted to selectively engage various contact pads 15 of a substrate 3 in a tester 4 controlled in a well known manner by a computer 5. Each probe, such as 2-1, connects a net, associated with the contact pad to which it is connected, to a respective one of a plurality of network sensitive pulse generators 100-1 to 100-n. The output of each network sensitive pulse generator 100-1 to 100-n is coupled to an input of a respective pulse counter and interface circuit 6-1 to 6-n. The network sensitive pulse generators 100-1 to 100-n are the subject matter of the above-identified earlier filed, copending application.

The computer 5 includes a central processing unit (CPU) 7. The CPU 7 includes a data bus 8, an address bus 9, and a control bus 10. The computer 5 can be any one of a number of known general purpose computers.

The data bus 8, the address bus 9, and the control bus 10 (or at least portions thereof) are coupled to the tester 4 and to the pulse counter and interface circuits 6-1 to 6-n for programmed control of test procedures and test data acquisition by software routines executed by the computer 5. The software routines thereafter evaluate the acquired test data with known standards to determine whether or not the net associated with each contact pad 15 engaged by the probes 2-1 to 2-n have an unacceptable fault.

The preferred embodiment of each pulse counter and interface circuit 6-1 to 6-n will now be described in detail, reference being directed to FIGS. 2–4. The preferred embodiment of the network sensitive pulse generators 100-1 to 100-n, which are the subject matter of the earlier filed copending application, will be described in detail later with respect to FIGS. 5–9.

Figure 2:
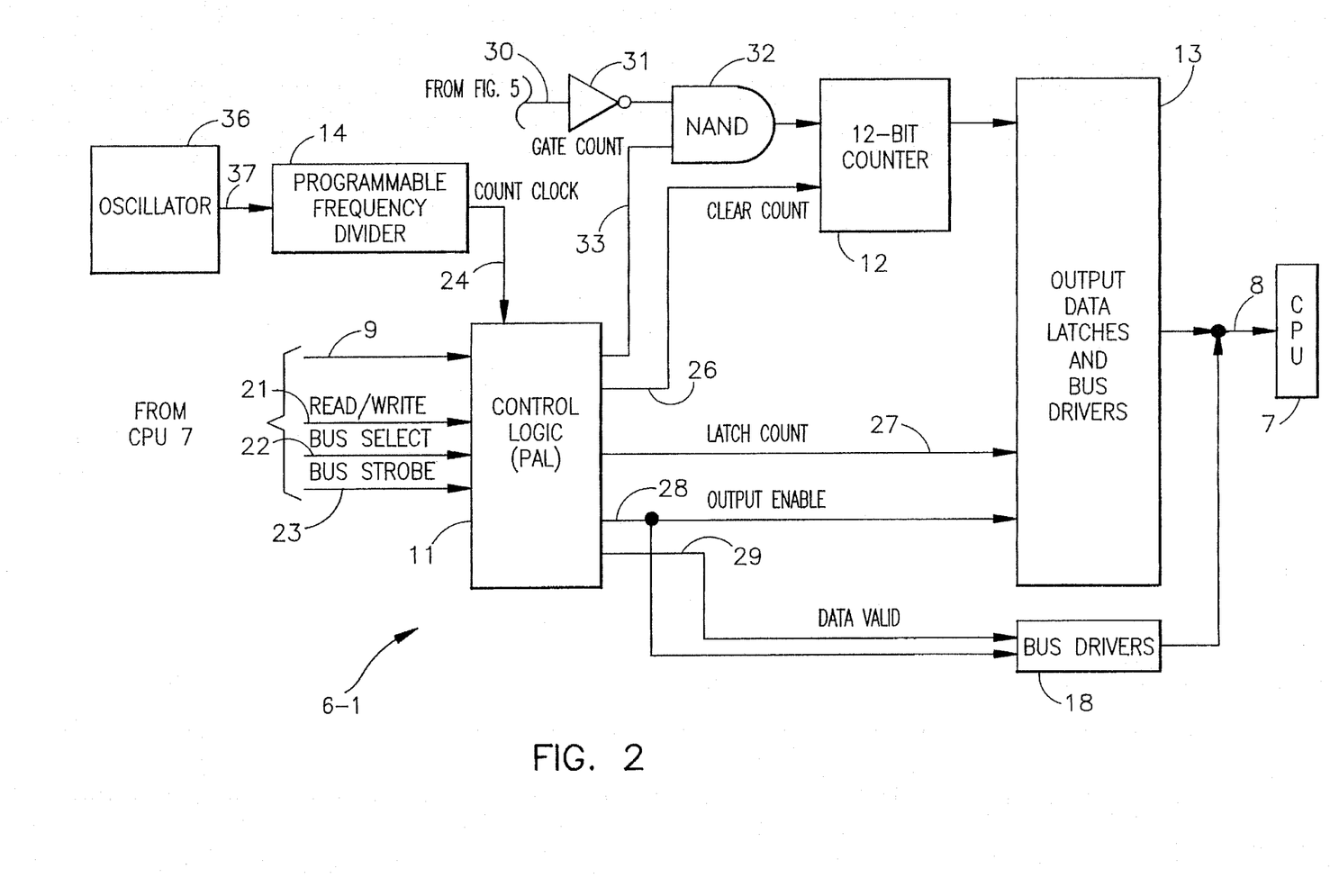
FIG. 2 is a simplified block diagram of the improved digital pulse counter and its interface to the computer.

FIG. 2 illustrates the preferred form of the pulse counter and interface circuit 6-1, and it provides a unique method and means for counting and recording the number of pulses generated by any source in a fixed period of time. It also provides a unique CPU bus interface that can be used by any standard programming language to manipulate the recorded data.

The circuit 6-1 can be used in many applications, however, it is particularly important in conjunction with the network sensitive pulse generator 100-1 to provide significantly improved test apparatus 1 for testing electrical and electronic circuits and in particular, wiring nets in a multilayer device carrier.

The preferred form of the circuit 6-1 of FIG. 2 includes control logic in the form of a programmable array logic (PAL) device 11 which is configured as a thirty-two (32) state gray code state machine and which is well known in the art.

The circuit 6-1 also includes a 12-bit counter 12, twelve output data latches 13 with conventional tri-state output bus drivers (not shown), a programmable frequency divider 14, and four tri-state output bus drivers 18. The data latches 13 are coupled (via their output tri-state drivers) to the lower twelve bits of a 16-bit data bus 8 and bus drivers 18 are coupled to the upper four bits of bus 8. The output of the counter 12 is coupled to the data latches 13.

The output of PAL 11 is coupled to a gate circuit 32 by way of gate count line 33, to the counter 12 by way of clear count line 26, to the latches 13 by latch count line 27 and output enable line 28, and to the bus drivers 18 by output enable line 28 and the data valid line 29.

An oscillator 36 having a frequency of 10 megahertz (10 MHz) in the preferred embodiment is coupled to an input of the programmable frequency divider 14 by way of line 37. The output of the frequency divider 14 is coupled to an input of the PAL 11 by count clock line 24.

In the preferred embodiment, the six lower bits of the address bus 9 and the read/write (R/W) line 21, bus select line 22 and, bus strobe line 23 of the control bus 10 of the CPU7 are coupled to inputs of the PAL 11. Input pulses to be counted are applied to the counter 12 by way of input line 30 (from FIG. 5), a custom line receiver 31, and NAND circuit 32. A gate count line 33 from the PAL 11 forms another input to the circuit 32. A local clock oscillator 36 is connected to an input of frequency divider 14 by way of line 37.

Figure 3:
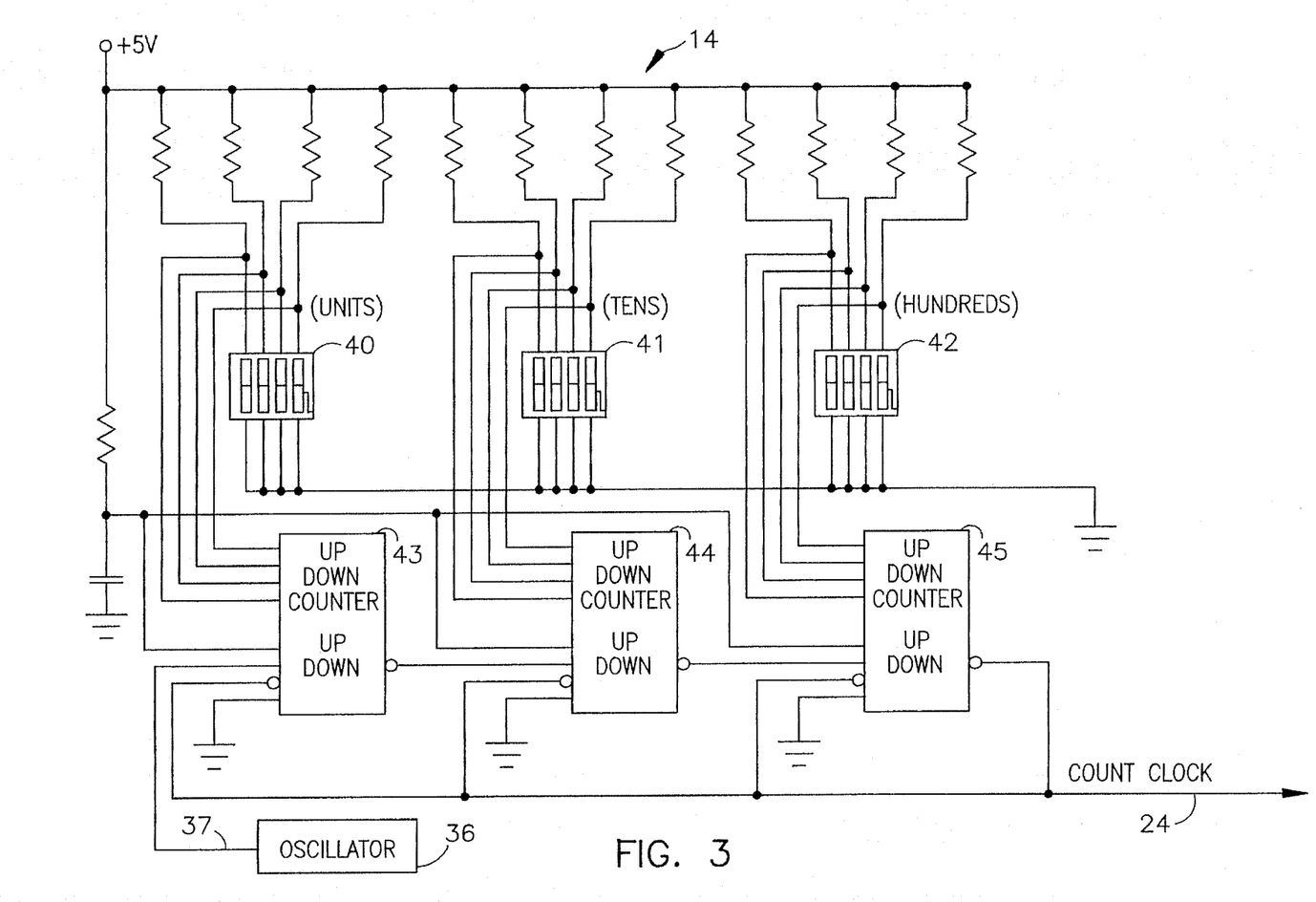
FIG. 3 illustrates diagrammatically a conventional programmable frequency divider which is used in a preferred embodiment of the pulse counter.

The programmable frequency divider 14 shown in more detail in FIG. 3 is of conventional construction and includes three four-bit dip switches 40, 41, 42 and three four-bit programmable counter chips 43, 44, 45. The frequency divider 14 sets the fixed period of time of one cycle of a data gathering operation which is required for proper operation of the 32-state gray code machine within the PAL 11, i.e. two milliseconds in the preferred embodiment. The PAL 11 receives the address and control signals from the CPU 7, along with the count clock signal from the frequency divider 14, and generates the control signals which are sent to the gated counter 12 and bus interface data latches 13 and tri-state drivers 18. The output of the data latches 13 along with the data valid signal on line 29 connect to the CPU data bus 8 through the tri-state bus drivers.

Each four-bit dip switch 4-42 is set for a decimal number from 0 to 9 by selecting the proper binary setting for each individual binary bit, such that together they correspond to a three-digit decimal number that has been selected. Dip switch 40 corresponds to the units value, dip switch 41 corresponds to the tens value, and dip switch 42 corresponds to the hundreds value of the number that is the divisor of the frequency divider circuit. The local clock is an oscillator 36 arbitrarily selected to have a 10 MHz frequency. The divisor is set in the preferred embodiment at 714 and the resulting count clock frequency will be 14 KHz which has a period of 71.4 microseconds. Since the PAL internally divides the count clock signal in half, the resulting internal clock width of the PAL, and subsequently, the time of one state in the state machine will also be 71.4 microseconds. From the timing diagram (FIG. 4), one can see that four states of the state machine are used for control while the other 28 states are used to establish the fixed gate time during which the incoming pulses are counted. Therefore, the gate time is equal to 28 times 71.4 microseconds, which is 1999.2 microseconds, or approximately two milliseconds. This time can be changed by selecting a different divisor with the dip switches.

It will be seen below, with respect to a description of the network sensitive pulse generator 100-1, that in a preferred embodiment pulses are generated by generator 100-1 at 1.8 HHz so that approximately 3600 pulses will be counted by counter 12 in the 2 millisecond time period.

Figure 4:
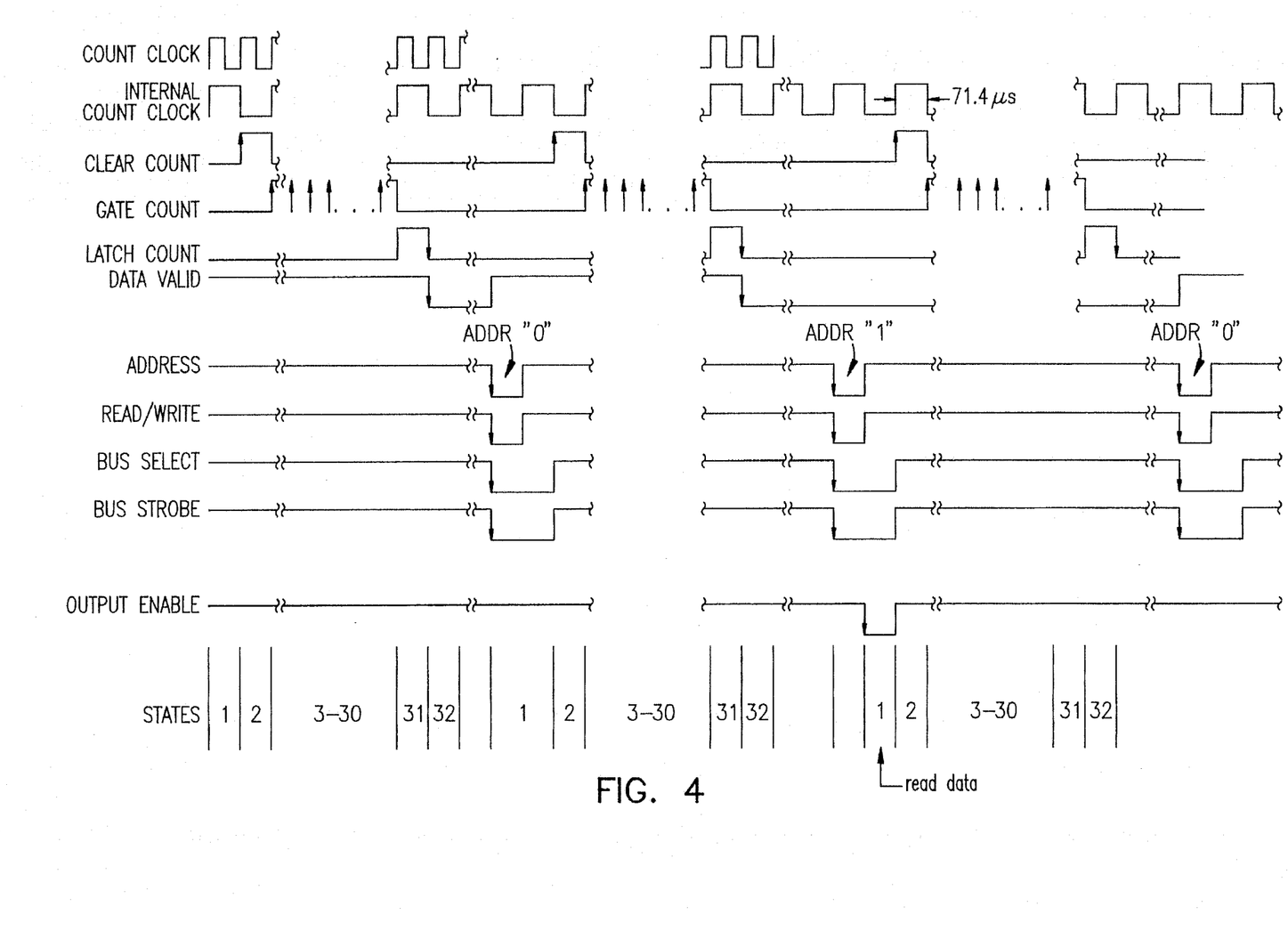
FIG. 4 is a timing diagram illustrating a preferred mode of operating the improved pulse counter and its computer interface.

In the timing diagram of FIG. 4, it can be seen that the external count clock pulses on line 24 are continuously applied to the PAL 11 to step the PAL through its 32 gray states over and over until interrupted by address and control signals from the CPU 7.

State 1 of the pal is a reset state; in state 2, the clear count signal on line 26 resets counter 12; in states 3–30, the gate count signal on line 33 gates incoming pulses from the network-sensitive pulse generator 100-1 into the counter 12; in state 31, the latch count signal on line 27 stores the count of counter 12 in data latches 13; in state 32, the data valid signal on line 29 is applied to one input of the bus drivers 18 but no action occurs because there is no output enable signal on line 29.

When the CPU 7 is operated under program control to acquire a test count for evaluation from circuits 100-1 and 6-1, it first places address zero on the address bus 9 as illustrated in FIG. 4.

In addition, the CPU 7 inputs a R/W signal, a bus select signal, and a bus strobe signal to the PAL 11.

It is noted that the CPU signals are asynchronous with respect to cycling of the PAL 11.

It is assumed for purposes of illustration that addresses zero and one are assigned to the test data acquisition means comprising probe 2-1, network sensitive pulse generator 100-1, and pulse counter and interface 6-1. Other pairs of addresses are assigned to each of the other test data acquisition means such as probe 2-n, circuits 100-n and 6-n. Each test data acquisition means responds only to its assigned pair of addresses.

In the preferred embodiment, when the CPU 7 is controlled to access test data from pulse generator 100-1 and pulse counter and interface 6-1, it asynchronously applies address "zero" to address bus 9 and R/W, BUS SELECT and BUS STROBE to lines 21, 22, and 23. This resets the PAL 11 to state 1 and initiates a counting cycle as the PAL 11 steps through states 2–32. This cycle requires a little more than 2 milliseconds. The CPU 7 is thereafter controlled by a timer (not shown) and programs therein to send address "one", R/W, BUS SELECT, and BUS STROBE to PAL 11 subsequent to the 2-millisecond counting cycle but prior to the completion of an additional counting cycle to transfer the count collected and stored in latches 13 to the CPU 7 via the lower 12 bits of data bus 8.

When the low active ADDRESS ZERO and the CPU control signals are applied to PAL 11, the PAL is reset to state 1 and the data valid signal on line 29 is returned to its high inactive state. When these signals all return to their high inactive states, the PAL is stepped to state 2 and continues the cycling of the PAL through its succeeding states under the control of the external COUNT CLOCK pulses on line 24.

During this time, the counting of pulses from the network sensitive pulse generator 100-1 is begun by clearing the count in counter 12 during state 2, i.e. CLEAR COUNT on line 26 goes high active and in states 3–30 GATE COUNT on line 33 goes high active to cause counter 12 to gather a count of the incoming pulses from generator 100-1. The count gathering process of the preferred embodiment requires approximately two milliseconds (28× 71.4 μs), at the end of which (state 31) LATCH COUNT on line 27 goes high active to transfer the count from counter 12 to data latches 13.

In state 32, DATA VALID on line 29 goes low active and the count in latches 13 and the DATA VALID signal are ready for transfer to the CPU 7.

As indicated above, the CPU 7 is controlled to apply address "1", R/W, BUS SELECT, and BUS STROBE signals to the PAL 11 prior to another two milliseconds. These signals reset the PAL 11 and cause the output enable signal to be applied to line 28. The output enable signal gates the count in latches 13 and the output of bus drivers 18 to the CPU data bus 8.

In the preferred embodiment, data valid line 29 is connected to each one of four bus drivers 18. The bus drivers 18 are connected to respect ones of the upper four bits of a 16-bit data bus 8. The twelve data latches 13 are connected to respective ones of the lower twelve bits of data bus 8 and count data is transferred from the latches 13 to data bus 8 when OUTPUT ENABLE goes low active. Because DATA VALID is low active, logical one signals are applied to the upper four bits of the data bus 8 (upon OUTPUT ENABLE on line 28 going low active). Count data from latches 13 will be transferred via the data bus 8 into CPU storage for evaluation only if CPU 7 detects logical 1s (F) on the upper four bits of the data bus.

The upper four bits on the data bus 8 corresponding to the state of the DATA VALID signal (0000 or 1111) determine whether or not a count stored in the latches 13 and applied to the lower twelve bits of the data bus 8 is valid and should be stored away for evaluation. Thus, the only control input to the CPU 7 from the counter and interface circuit 6-1 is applied by way of the CPU data bus 8. As a result, the test apparatus of FIG. 1 does not require a specific CPU 7; rather any general purpose CPU with appropriate programming may be used.

The following code of PAL 11 is implemented in a preferred embodiment to allow the PAL to perform all data gathering and recording operations. This code is written in standard "ABEL" format wherein "?" equals low active and ":" refers to a register output.

```
"PIN NAMES:
" INPUTS "
CK                          "COUNT CLOCK
A5,A4,A3,A2,A1,A0           "BUS ADDRESS
SL                          "BUS SELECT
RW                          "BUS READ/WRITE
ST                          "BUS STROBE
RESET (internal node)       "ASYNC RESET
" OUTPUTS "
CC                          "CLEAR COUNT
GC                          "GATE COUNT
LC                          "LATCH COUNT
S4,S3,S2,S1,S0              "STATE
DV                          "DATA VALID
OE                          "OUTPUT ENABLE TO DATA BUS
S4,S3,S2,S1,S0,DV ISTYPE 'REG' ;
SREG = [S4,S3,S2,S1,S0] ;
"CONSTANTS:
TRUE,FALSE - 1,0 ;
H = 1 ;
L = 0 ;
X=.X. ;
C=.C. ;
Z=.Z. ;
ADD=[A5..A0] ;
STATE VALUES (states A-PP correspond to states 1-32 of FIG. 4)
A = ^00000 ;          U = ^11000 ;
D = ^00001 ;          V = ^11001 ;
E = ^00011 ;          W = ^11011 ;
F = ^00010 ;          Y = ^11010 ;
G = ^00110 ;          AA= ^11110 ;
I = ^00111 ;          DD= ^11111 ;
J = ^00101 ;          EE= ^11101 ;
K = ^00100 ;          FF= ^11100 ;
M = ^01100 ;          GG= ^10100 ;
N = ^01101 ;          II= ^10101 ;
O = ^01111 ;          JJ= ^10111 ;
P = ^01110 ;          KK= ^10110 ;
Q = ^01010 ;          MM= ^10010 ;
R = ^01011 ;          NN= ^10011 ;
S = ^01001 ;          OO= ^10001 ;
T = ^01000 ;          PP= ^10000 ;
EQUATIONS
!OE      = ( RW & !ST & !SL & (ADD==^H01)) ;
!DV      := (S4 & !S3 & !S2 & !S1 & !S0) # !DV ;
RESET    = !ST & !SL & !RW & (ADD==^H00)
SREG.CK  CK ;
CC       = (!S4 & !S3 & !S2 & !S1 & S0)
!GC      = (!S4 & !S3 & !S2 & !S1 & !S0)
         # (!S4 & !S3 & !S2 & S1 & S0)
         # ( S4 & !S3 & !S2 & !S1 & S0)
         # ( S4 & !S3 & !S2 & !S1 & !S0) ;
LC       = ( S4 & !S3 & !S2 & !S1 & S0) ;
STATE_DIAGRAM SREG ;
STATE A :               STATE P :                STATE EE :
        GOTO D ;                GOTO Q ;                 GOTO FF ;
STATE D :               STATE Q :                STATE FF :
        GOTO E ;                GOTO R ;                 GOTO GG ;
STATE E :               STATE R :                STATE GG :
        GOTO F ;                GOTO S ;                 GOTO II ;
STATE F :               STATE S :                STATE II :
        GOTO G;                 GOTO T ;                 GOTO JJ ;
STATE G :               STATE T :                STATE JJ :
        GOTO I ;                GOTO U ;                 GOTO KK ;
STATE I :               STATE U :                STATE KK :
        GOTO J ;                GOTO V ;                 GOTO MM ;
STATE J :               STATE V :                STATE MM :
        GOTO K ;                GOTO W ;                 GOTO NN ;
```

| STATE K : | | STATE W : | | STATE NN : | |
|---|---|---|---|---|---|
| | GOTO M ; | | GOTO Y ; | | GOTO OO ; |
| STATE M : | | STATE Y : | | STATE OO : | |
| | GOTO N ; | | GOTO AA ; | | GOTO PP ; |
| STATE N : | | STATE AA : | | STATE PP | |
| | GOTO O ; | | GOTO DD ; | | GOTO A ; |
| STATE O : | | STATE DD : | | | |
| | GOTO P ; | | GOTO EE ; | | |

The novel network sensitive pulse generator circuit according to a preferred embodiment of the invention will now be described. Certain well-known components of this circuit embodiment, such as voltage references and current sources, are only briefly described to aid clarity. The operation of the circuit is then described, first generally and then in detail.

Figure 5:
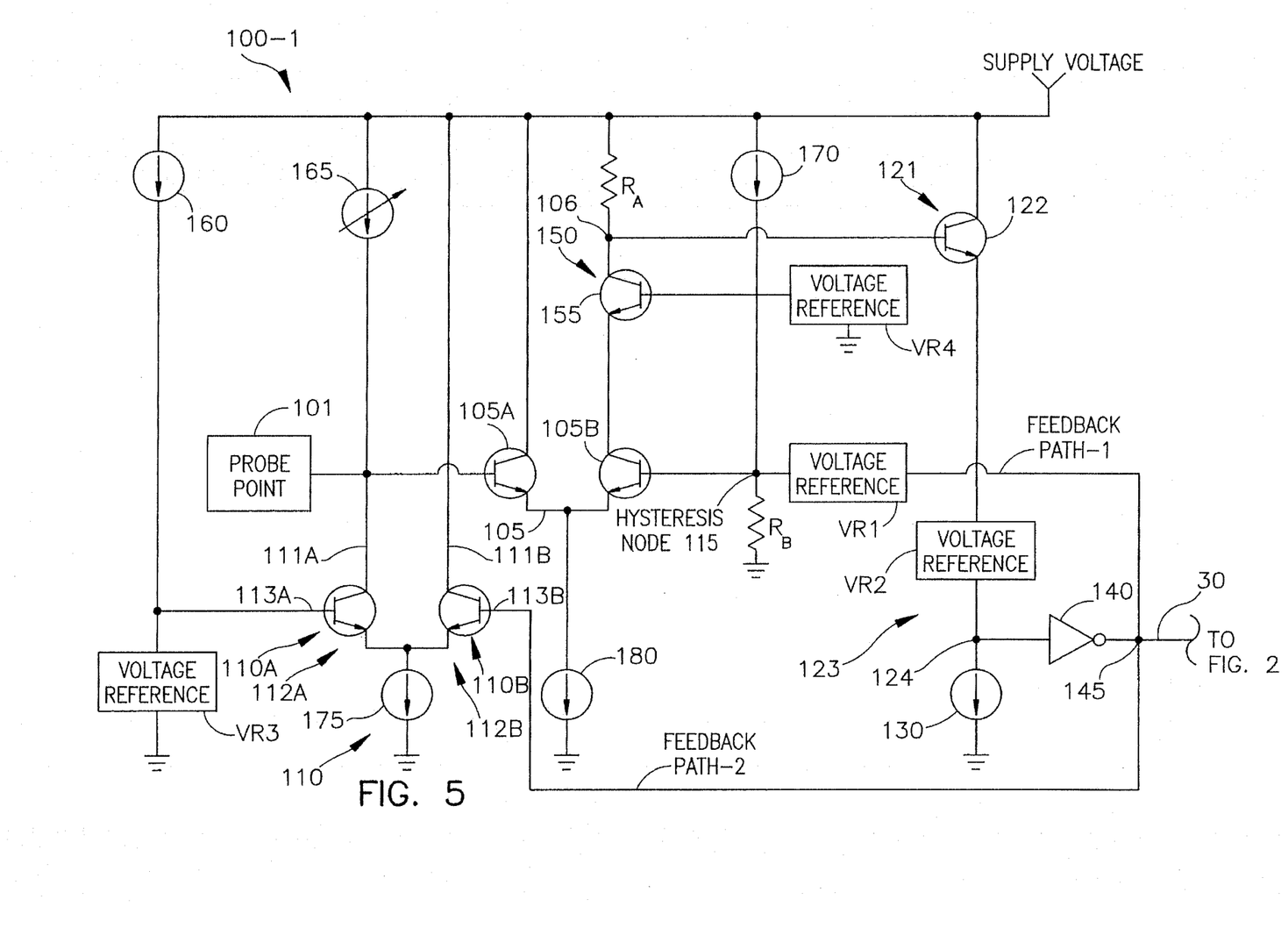
FIG. 5 illustrates a network sensitive pulse generator circuit according to a preferred embodiment of the invention.

FIG. 5 illustrates a novel network sensitive pulse generator circuit 100-1. Circuit 100-1 generally includes a first differential amplifier circuit 110, a second differential amplifier circuit 105, a voltage level shifter circuit 123, and an inverter circuit 140. The net to be tested is coupled to a probe point 101 via probe 2-1, FIG. 1.

The first differential amplifier 110 includes a first transistor 110A, a second transistor 110B, a user-adjustable current source 165, and a current sink 175. The transistors 110A and 110B are connected at their emitters 112A and 112B, respectively, which are coupled to current sink 175. In a preferred embodiment, current sink 175 draws 5 ma. Collector 111A of transistor 110A is coupled to current source 165 and to probe point 101. Current source 165, described below, is user adjustable to supply current from 0.4 ma to 2.5 ma and is coupled to a supply voltage, e.g., 15 volts in a preferred embodiment. A collector 111B of transistor 110B is coupled to the supply voltage. A base 113A of transistor 110A is coupled to a voltage reference VR3, described below, which in a preferred embodiment provides approximately 1.8 volts, and base 113A is also coupled to current supply 160, which in a preferred embodiment provides 1 ma. A base of transistor 110B is coupled to node 145 via feedback path-2.

Probe point 101 is also connected to a second differential amplifier 105, which generally comprises a first transistor 105A, a second transistor 105B, a current sink 180, a common base amplifier 150, and a resistor $R_B$. More particularly, collector 111A is coupled to a base of a first transistor 105A. The collector of transistor 105A is coupled to the supply voltage, and the emitter of transistor 105A is coupled to the emitter of second transistor 105B. The two emitters, in turn, are coupled to current sink 180, which in a preferred embodiment draws 0.5 ma. The collector of transistor 105B is coupled to a common base amplifier circuit 150, described below, which is coupled to the supply voltage, via resistor $R_A$. The base of transistor 105B is coupled to a "hysteresis" node 115, which is described below.

The common base amplifier 150 includes an npn-type transistor having its emitter coupled to node 106 and its collector coupled to resistor $R_A$. The base of transistor 155 is coupled to a voltage reference VR4, which is 7.4 volts in a preferred embodiment. The common base amplifier 150 improves the switching speed of second differential amplifier 105.

Node 115 is coupled to ground via resistor $R_B$ and is also coupled to a current source 170, which provides 5 ma in a preferred embodiment and which is also coupled to the supply voltage. Node 115 is further coupled to a voltage reference VR1, which is also coupled to node 145, which in a preferred embodiment causes node 115 to attain 3.0 volts, when VR1 is on. VR1 is further described below.

Collector node 106 of transistor 105B is coupled to the base 121 of transistor 122 of emitter follower circuit 120. Emitter follower circuits are known. A collector of transistor 122 is coupled to the supply voltage, and a an emitter of transistor 122 is coupled to a level shifter circuit 123.

Level shifter circuit 123 includes band-gap voltage reference VR2 and a current sink 130. As will be further described below, this level shifter in conjunction with the follower circuit 120 includes certain novel aspects, including an unusually fast response time for converting differential amplifier output signals to CMOS levels. Level shifter circuit 123 includes a node 124 between band-gap voltage reference VR2 and current sink 130. Band-gap voltage references are known in the art. Typically, they are depicted with symbols that appear similar to those used for zener diodes, except that they have a third terminal, see, e.g., FIG. 7. Unlike zener diodes, band-gap voltage references are relatively immune to temperature over a broad range of temperatures, and they are relatively immune to the amount of current flowing through the device.

An input of a CMOS inverter 140 is coupled to node 124, and an output node 145 of CMOS inverter 140 is coupled to several elements. First, the output 145 is connected, via feedback path-1, to voltage reference VR1. Second, output node 145 of CMOS inverter 140 is coupled to the base 113B of transistor 110B of first differential amplifier 110 via feedback path-2. Third, the output 145 of CMOS inverter 140 provides the output pulses of the super circuit and is connected via line 30 to the improved pulse counting hardware 6-1 of FIG. 2 to provide the signature of the net coupled to probe point 101.

The operation of the circuit of FIG. 5 will now be described, first generally, and then more specifically. Generally, a net of substrate 3 (FIG. 1) under test is coupled to probe point 101 by probe 2-1. The net under test is a multiple series-parallel RLC network and the actual construction and arrangement of the net need not be known a priori. However, portions of the net will be connected to a reference potential which is usually circuit ground. A "super circuit" is thus formed from the combination of the net under test and the novel network sensitive pulse generator circuit 100-1. As will be further described below, the super circuit behaves as an oscillator and produces a train of output pulses, or signature, at output node 145 where the frequency and duty cycle depend on the overall RLC time constants in the net under test.

Conventional pulse counting circuits may be coupled to node 145 to convert the output pulse train to a digital binary or hexadecimal signature number, for example. Alternatively, a testing system such as that shown in FIG. 1 may directly receive and count the pulses from node 145. The signature or the signature number may then be analyzed by testing software, for example, by comparing it to a known good signature. The known good signature may be produced in similar manner, i.e., by connecting a known good device to the novel circuit 100-1, or it may be provided by the manufacturer of the circuit being tested.

More specifically, connecting the net under test to probe point 101 places the multiple series-parallel RLC network of the net between the probe point 101 and a test reference point, e.g., ground. The probe point 101 is connected to a variable current source which is, in turn, controlled by the output of the test circuit. Consequently, the aforementioned output pulse train will affect the current flowing through the net under test. This variable current generates a variable voltage across the net which voltage is sensed and used to control a binary output. The super circuit contains a feedback loop so that a high output signal reduces the current being applied to the net under test. The reduced current, in turn, causes the voltage to decrease across the net. When the voltage decreases to a predetermined level, a low output signal is generated and the current source is controlled to increase the current applied to the net. In response, the voltage across the net increases until a second predetermined level is reached at which point a low output signal is generated. This process is repeated to generate a series of pulses with characteristics that are dependent on the net under test.

Now the operation of the circuit will be described more specifically. The probe point 101 is connected to a differential amplifier in the test circuit 100-1. As described above, a preferred embodiment of circuit 100-1 uses two differential amplifier circuits, constructed from npn-type transistors. Though the operation and behavior of differential amplifiers are known in the art, a brief review is provided to aid clarity. A differential amplifier, constructed of BJT technology, receives voltage signals at the base junctions of each transistor of the differential amplifier. The current in the collector of each transistors is then "steered" according to a known relationship, which depends on the voltage difference between the base junctions. The transistor having a higher base junction voltage of the two will attain a higher collector current. Consequently, the current from the current sink will split between the net under test and the current running through the differential amplifier. As will hereinafter be described, the differential amplifier is also connected to the circuit output. Consequently, the output pulse train will affect the current flowing through the differential amplifier.

The second differential amplifier 105 senses the voltage level at the probe point 101, as a function of time, and provides an output voltage at node 106 that depends on the amount of collector current of transistor 105B. The amount of collector current, in turn, depends on the voltage difference across the base junctions of transistors 105A and 105B, i.e., the net under test's voltage and the voltage at hysteresis node 115.

The output 106 of the second differential amplifier 105 is coupled to an emitter follower circuit 120. The emitter follower circuit 120 is coupled to a level shifter circuit 123, which shifts the voltage signal provided by the emitter of transistor 122 to a compatible voltage for CMOS inverter 140. Thus, the differential amplifier 105 signal from node 106 is made compatible with CMOS.

The CMOS inverter 140 generates CMOS logic level output pulses at node 145. As is known in the art, CMOS inverter 140 drives output signals "rail-to-rail," i.e., 0 to 5 volts, and CMOS circuits are capable of sinking and sourcing equal amounts of current. These aspects of CMOS inverters were found to improve the performance of the circuit 100-1, without causing instability in the production of signature pulses. That is, at the preferred speed of operation, 1.8 Mhz, the sharp rise time and other characteristics of a CMOS signal in conjunction with the characteristics, described above, were found to alleviate problems of signature drift (i.e., the possibility of a same net producing two signatures).

The output pulses from inverter 140, when changed, change the voltage level at the second differential amplifier 105, via voltage reference VR1, described below, as well as changing the level of current applied to the net under test at the probe point 101, by changing the voltage at the base 113B of transistor 110B of the first differential amplifier 110.

The voltage at the probe point 101, i.e., the response of the net under test, rises and falls, as a function of time, depending upon three general factors:

(1) the configuration and component values of the multiple series-parallel RLC net under test connected between the node 101 and the reference point, e.g., ground;

(2) the magnitude and direction of the current entering or leaving the probe point, which, in turn, depends upon the behavior of the first differential amplifier 110, which, in turn, depends on the relationship of the base junction voltages; and (3) the upper and lower hysteresis voltage values present at the hysteresis node 115.

The upper hysteresis voltage value is equal to the voltage drop across resistor $R_B$. This occurs when VR1 is off. As such, the upper hysteresis voltage equals the product of the value of the current source 170 entering the hysteresis node 115, 5 ma, and the value of resistor $R_B$ (1K ohm). The lower hysteresis voltage value is equal to the value of voltage reference VR1, which in a preferred embodiment equals 3.0 volts. The operation of voltage reference VR1 is further described below.

When the voltage at the probe point 101 becomes slightly less than the lower hysteresis voltage value at the hysteresis node 115, the collector current of transistor 105B increases. The increased current causes the voltage drop across resistor $R_A$ to increase, which causes the voltage at node 106 to drop. This, in turn, causes the voltage at the emitter of the transistor 122 to be lowered. The emitter voltage of transistor 122 is then shifted by band-gap voltage reference VR2 of level shifter 123 to a voltage that is compatible with CMOS inverter 140. More particularly, the voltage level shift causes the voltage at the input 124 of CMOS inverter 140 to be approximately 0 volts, i.e., logic level "0." As such, the output 145 of the CMOS inverter 140 becomes logic level one, e.g., 5 volts. This represents the first of a series of pulses that are continuously generated.

When the output 145 of the CMOS inverter 140 moves to 5 volts, it also resets the voltage value at the hysteresis node 115 to the upper hysteresis voltage value by turning off VR1. Output node 145 attaining a 5-volt level also changes the magnitude and direction of the current stimulating the net under test at the probe point 101 by changing the value on base 113B of transistor 110B of first differential amplifier 110. More particularly, supplying 5 volts to base 113B causes more current to flow in collector 111B and less current to flow in collector 111A, because the 5 volts at 113B is higher than the voltage provided by VR3, e.g., 1.8 volts.

Less current in collector 111A causes a smaller voltage drop from the net under test and thus causes the voltage at the probe point 101 to move upward in value, as a function of time. When the voltage at collector 111A and the base of transistor 105A becomes slightly greater in value than voltage at hysteresis node 115, which is now the upper hysteresis voltage value, more current is drawn in the collector of transistor 105A and less current from the collector of transistor 105B. A lower current in the collector 105B causes a lower voltage drop across resistor $R_A$ and thus causes the voltage at node 106 to rise. As such, the voltage at the emitter of transistor 122 rises in value. The common base amplifier 150 improves the speed of second differential amplifier 105.

The level shifter 123 is coupled to the emitter of transistor 122 and shifts the emitter voltage value via band-gap voltage reference VR2 to a value at node 124 to a CMOS compatible level, i.e., approximately 5 volts. This causes the output 145 of the CMOS inverter 140 to become 0 volts. The zero volts is fed back to VR1 and the base 113B to adjust the sensing of the net's response by differential amplifier 105 and to adjust the stimulation of the net by differential amplifier 110. This completes one cycle of operation, which generates one output pulse from logic 1 to logic 0.

The amount of time it takes for the probe point 101 to change in value sufficient to change the steering relationship of the second differential amplifier 105 and thus change the pulse at node 145 depends upon the transient behavior of the multiple series-parallel RLC circuit of the net under test and the amount of current being steered in the first differential amplifier 110. In a given amount of time, the super circuit produces a given number of pulses at node 145. In a preferred embodiment, 2 milliseconds is used to generate a signature. Moreover, in a preferred embodiment the super circuit may operate at up to 1.8 MHz, which may generate up to 3600 pulses in the 2 ms period.

If the net under test is different in any way from a known good net, the time with which it takes to complete a cycle of operation, discussed above, changes. More specifically, if the net under test is defective, the time constant characterizing the multiple series-parallel RLC arrangements of the net under test changes. The changed time constant changes the amount of time necessary to complete a cycle of operation described above, and this causes the defective net to produce a different number of pulses in the fixed period of the test, thus producing a different signature, which is defined as the number of pulses produced in the fixed period.

The configuration and component values of the net under test need not be known by the test operator. Any defects to the net under test, e.g., defects in the component values or configuration, are recognized by the super circuit generating a signature that is different than a known good signature. Given the high speed of operation and the high number of pulses generated in a fixed time, the circuit 100-1 may generate relatively precise signatures. When comparing the signature of the net under test to the good signature, the test operator may wish to incorporate a certain amount of tolerance in mismatched signatures. As stated above, the RLC characteristics of a particular net, or the sinusoidal impedance of the net, are not measured. Rather, the signatures depend upon the transient behavior of the net under test in conjunction with the novel network sensitive pulse generator circuit 100-1.

Now, exemplary constructions of the various abstracted components of FIG. 5 are described.

Current sinks 175 and 180 are conventional and are implemented by biasing base junctions of npn transistors (not shown) with a predetermined voltage, e.g., 1.2 volts. The collectors of the transistors are coupled to respective differential amplifiers, and the emitters are coupled to ground via biasing resistors. In a preferred embodiment current sink 175 draws 5 ma and current sink 180 draws 0.5 ma.

Current sink 130 (1 ma) is also conventional. A npn transistor (not shown) has its base biased with an op-amp (not shown), which is biased to cause the transistor to be in a conductive state. The collector of the transistor is coupled to node 124 and the emitter is coupled to a negative power supply, e.g., −15 volts.

Likewise, current sources 160 (5 ma) and 170 (5 ma) are conventional. A preferred embodiment, for example, uses the current sources depicted in FIG. 6A. Current source 200 includes an op amp 201, which receives a predetermined voltage, e.g., 5 volts, between the supply voltage input and the positive input, and which has its negative input coupled to the emitter junction of a pnp transistor 202. The collector of transistor 202 provides the current I.

Figures 6A, 6B:
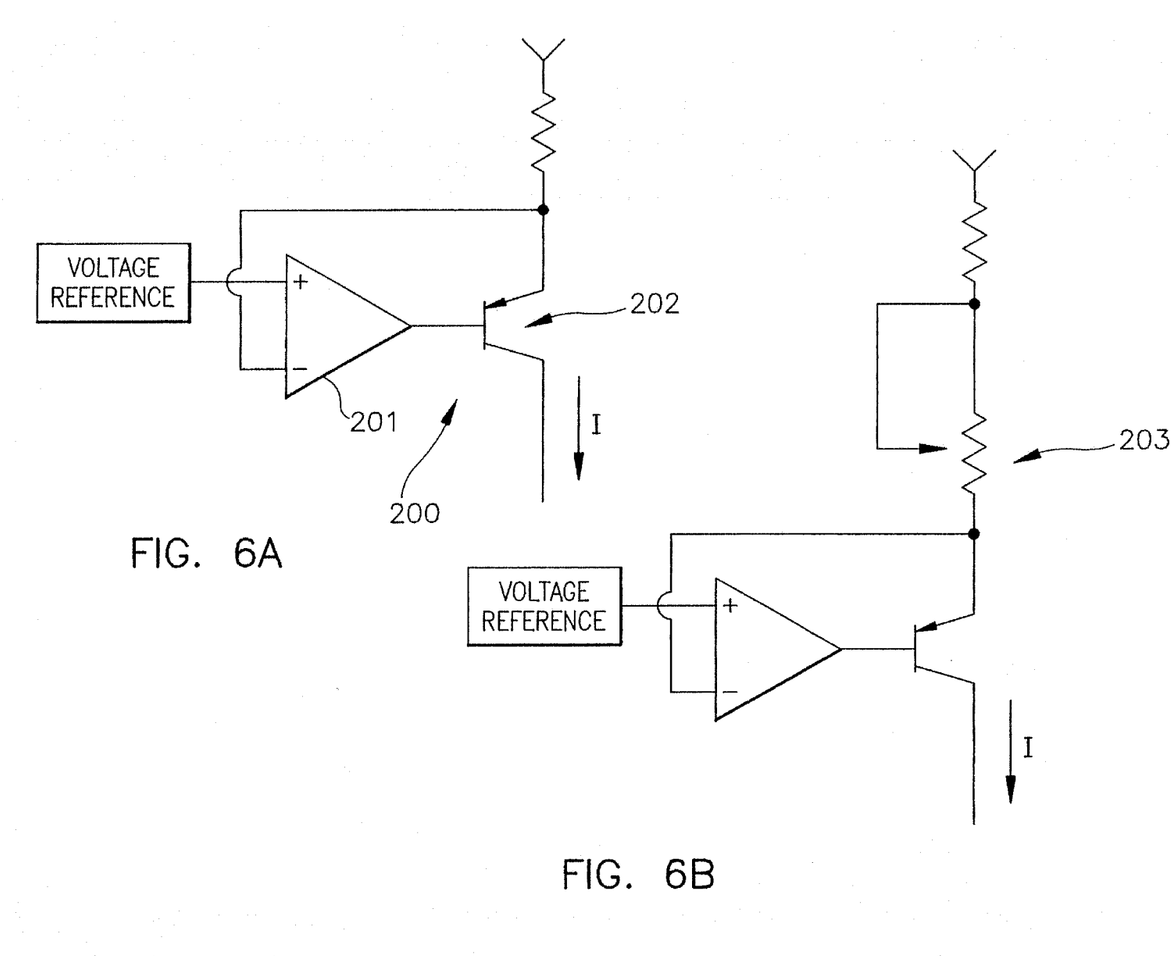
FIG. 6A illustrates current source circuits according to a preferred embodiment of the invention.
FIG. 6B illustrates another current source according to a preferred embodiment of the invention.

FIG. 6B illustrates a preferred embodiment of current source 165, which is user modifiable via potentiometer 203. User adjustment may be needed to calibrate the system for variances in the characteristics of a cable which may be used to couple the net under test to the probe point 101. Increasing or reducing the resistance of potentiometer 203 causes less or more current to flow from source 165, which changes the speed of operation of the super circuit. As such, a system may be calibrated by leaving the probe unconnected and adjusting the potentiometer 203 such that a maximum count signature, e.g., 3600, is produced in a fixed time, e.g., 2 ms.

Figure 7:
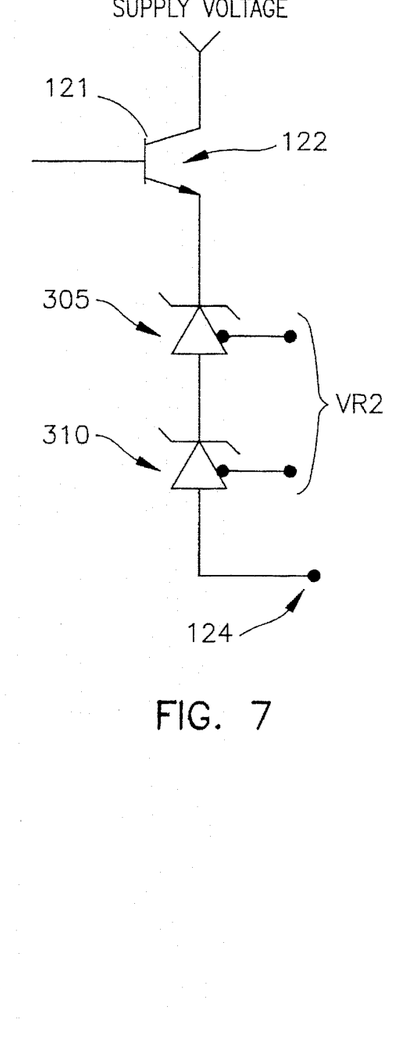
FIG. 7 illustrates a voltage reference circuit according to a preferred embodiment of the invention.

Referring to FIG. 7, a preferred implementation of voltage reference VR2 is illustrated. VR2 uses two band-gap voltage references 305 and 310 to drop the emitter voltage of transistor 122 a total of 10 volts. As suggested above, level shifter 123 includes certain novel aspects. Typical level shifters are formed from zener diodes and resistors; sometimes they are formed with resistors and current sinks or sources. In contrast, the level shifter 123 shifts the signal from node 106 with a follower circuit 120, band-gap voltage reference VR2, and a current sink 130, described above. This arrangement yields a much improved switching response time, which improves the performance of circuit 100-1.

Figure 8:
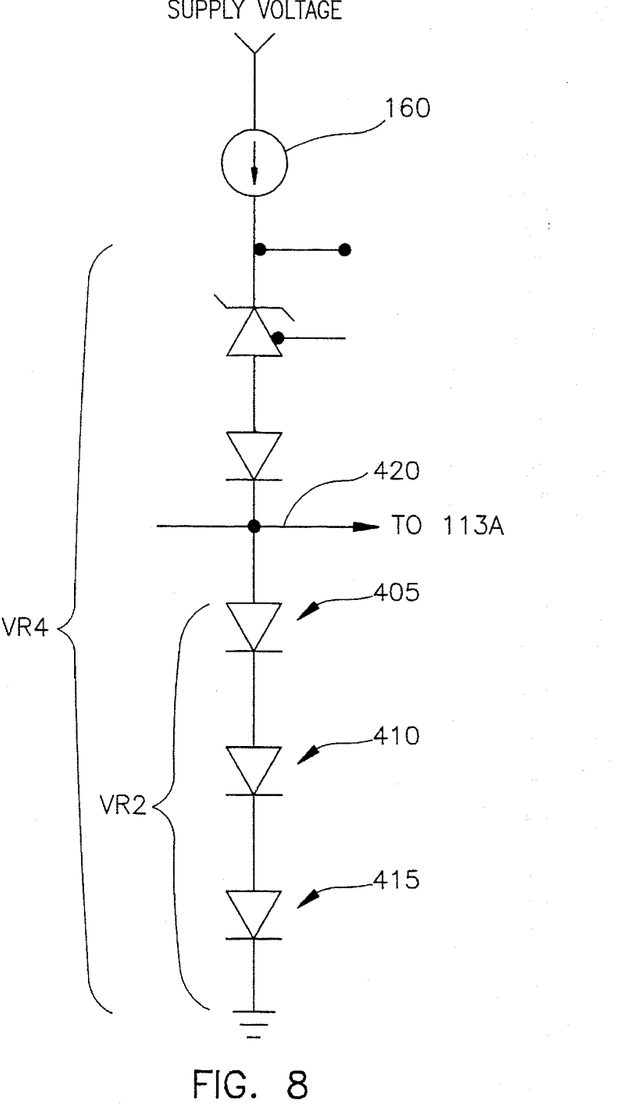
FIG. 8 illustrates another voltage reference circuit according to a preferred embodiment of the invention.

Referring to FIG. 8, a preferred implementation of voltage reference VR3 is illustrated. VR3 uses 3 diodes 405, 410, and 415, in which anode of diode 405 is coupled to the voltage reference point 420, which is coupled to base 113A (see also FIG. 5). Each diode is then series connected, anode to cathode, to provide a voltage at 420, depending upon the voltage drop of each diode, e.g., 0.6 volts.

Figure 9:
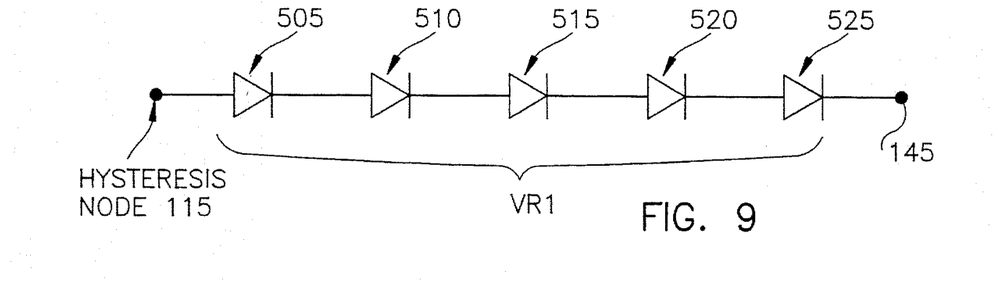
FIG. 9 illustrates another voltage reference circuit according to a preferred embodiment of the invention.

Referring to FIG. 9, a preferred implementation of voltage reference VR1 is illustrated. VR1 is formed by a series connection of five diodes 505–525, each having its cathode connected to an anode of a subsequent diode, the cathode of diode 525 being connected to node 145 (see also FIG. 5) and the anode of diode 505 being connected to node 115 (see also FIG. 5). Consequently, when node 145 is at zero volts, the diodes are biased so that each experiences a corresponding voltage drop, e.g., 0.6 volts. This causes VR1 to produce a predetermined voltage at node 115 of approximately 3.0 volts. When node 145 is at 5 volts, the diodes are off and thus VR1 is turned off. Thus, as seen from FIG. 5, the voltage at node 115 is determined from the value of the current source 170 multiplied by the value of the resistor $R_B$.

VR4 is constructed of band-gap voltage references and diodes to provide a voltage of 7.4 volts (see FIG. 8).

Figure 10:
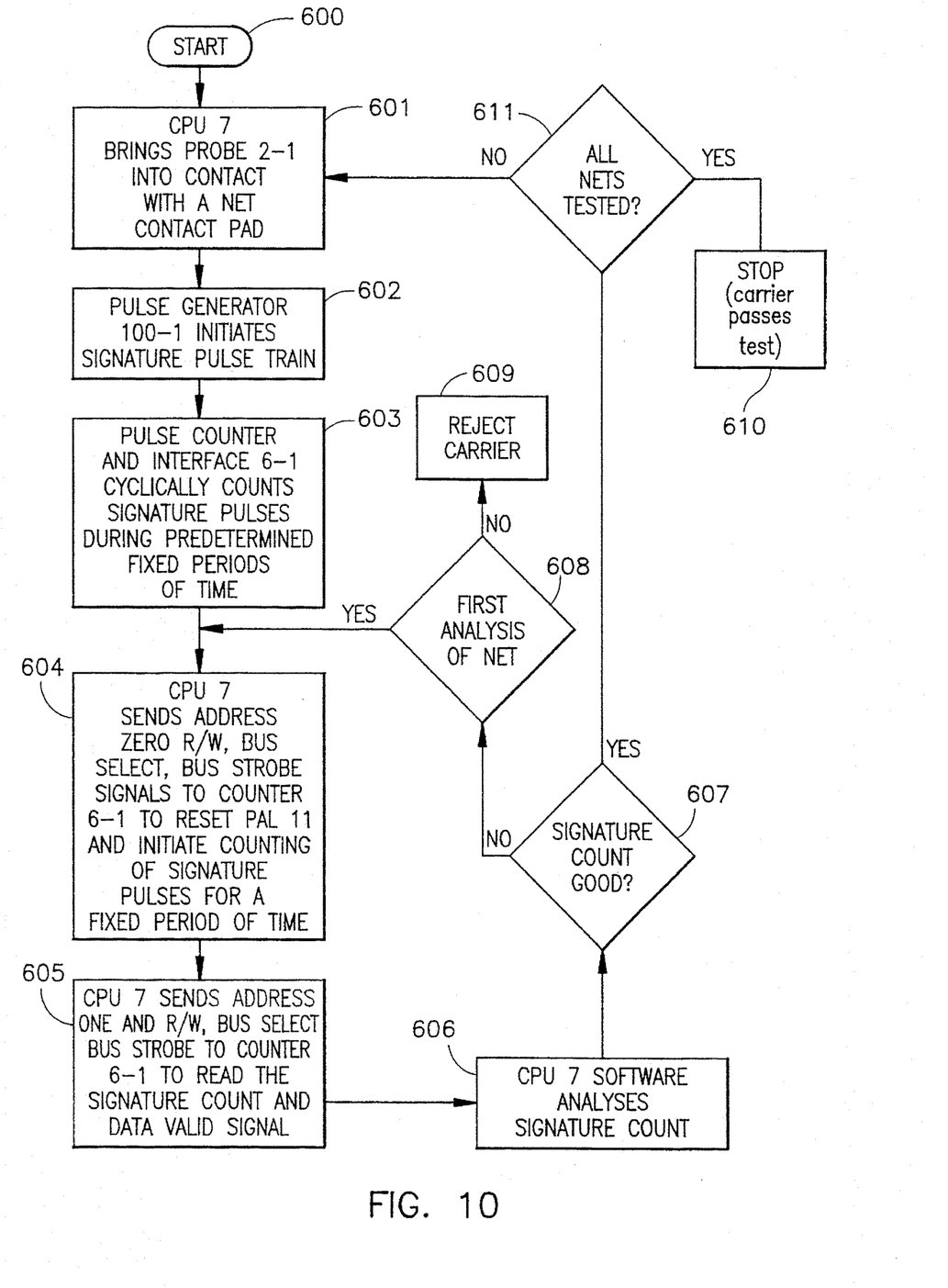
FIG. 10 is a flow chart illustrating a method of using the test apparatus according to a preferred embodiment of the invention.

FIG. 10 briefly illustrates a method of using the test apparatus of FIG. 1 to evaluate electrical nets of an electrical or electronic circuit in a multi-layer device carrier 3.

The test begins with step 600 and proceeds through steps 601–608 until either a carrier 3 is rejected in step 609 or the carrier is accepted in step 610. It will be assumed in FIG. 10 that only one probe 2-1 is used to test all nets in carrier 3. It is readily apparent that, if more than one probe is controlled by the CPU 7, the sequence of steps in FIG. 10 may be performed for each of the probes in a sequence determined by the CPU 7.

In step 601, the CPU 7 controls movement of the probe 2-1 into contact with one of the contact pads 15. This immediately initiates signal pulse generation by the pulse generator circuit 100-1, step 602.

Asynchronously, the PAL 11 is being stepped through its states 1–32; and each time that the PAL 11 steps through states 3–30, it counts pulses from pulse generator circuit 100-1 (in the preferred embodiment pulses are counted for a two-millisecond time period). During each state 31, the count is transferred to output latches 13.

When the CPU 7 is ready to acquire a pulse count (step 604) it resets the PAL 11 to initiate a new count which is a signature count to be evaluated. After a time period between two and four milliseconds, the CPU 7 in step 605 controls the counting circuit 6-1 to apply the signature count and a data valid signal to the data bus 8.

CPU software (not shown) in step 606 analyzes and evaluates the signature count and in step 607, rejects or accepts the count as valid. If the signature count is not valid, CPU 7 determines if this is the first time the net under test was evaluated. If it is the first evaluation, steps 604, 605, and 606 are repeated for a second attempt to find the net acceptable. If in step 608 the second (or as many as desired) evaluation fails, the carrier 3 under test is rejected.

If in step 607 the net is determined to be acceptable, then the CPU 7 determines whether or not all nets in the carrier 3 have been tested; and the testing is completed for the carrier in step 610 if all nets have been successfully tested. If all nets have not been tested at step 611, the probe 2-1 is moved to another contact pad; and the test process repeats itself for the net associated with the contact pad.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. Apparatus for testing individual wiring nets in a multi-layer device carrier comprising:

a probe controlled by a central processing unit for engaging contact pads on the multi-layer device carrier in sequential order, each pad being electrically connected to a respective one of said wiring nets;

a binary signature signal generating circuit electrically coupled to the probe and effective while the probe is in engagement with each contact pad for generating a train of signature signal pulses having a frequency uniquely characteristic of the wiring net of the engaged contact pad;

a pulse counting circuit coupled to the signature signal generating circuit for counting the number of pulses in each train of pulses which are received during a predetermined period of time for storing a count value for each counted number of pulses and for producing an output data valid control signal; and means included in the pulse counting circuit and controlled by the central processing unit for transferring the data valid control signals and the count values to a data bus of the central processing unit for evaluation of the count values.

2. The apparatus set forth in claim 1, wherein the central processing unit under program control compares the transferred count values with known count values corresponding to wiring nets free of unacceptable defects.

3. The apparatus of claim 1, wherein the binary signature signal generating circuit comprises:

means, responsive to the signature signal pulses, for applying a stimulus having a magnitude to the net, the applying means reducing the stimulus magnitude in response to a signature signal pulse having a first level and increasing the stimulus magnitude in response to a signature signal pulse having a second level; and means, responsive to a magnitude of a net response to the stimulus, for generating the signature signal pulses, the generating means constructed to generate a signature signal pulse having a first level when the net response magnitude increases to a first threshold and to generate a signature signal pulse having a second level when the net response magnitude decreases to a second threshold.

4. The apparatus of claim 1, wherein the pulse counting circuit comprises:

a programmable array logic (PAL) device configured as an n-state gray code state machine;

a source of clock signals applied to the PAL to repetitively sequence the PAL through its n states;

data output latches;

a binary counter coupled to an output of the signature signal generating circuit for counting pulses in said train of pulses;

said PAL coupled to said counter and latches and effective in one state for resetting the counter to zero, in subsequent second states for rendering the counter effective for counting pulses in each train of pulses applied thereto during a predetermined period of time, and in subsequent third states for gating a count value from the pulse counter to the data output latches and for producing an output data valid signal;

wherein said central processing unit includes said data bus coupled to the data output latches and to a data valid output of the PAL and includes an address bus and selected control bus lines coupled to inputs of the PAL;

wherein said PAL is responsive to first address signals on the address bus and control signals on the selected control bus lines for resetting the PAL to said one state for initiating counting of said pulses in a train of pulses as the PAL is subsequently stepped through said n states by the clock signals; and wherein said PAL is thereafter responsive to second address signals on the address bus and control signals on the selected control bus lines for producing an output enable signal, said output enable signal gating the count value in the data output latches and the data valid signal to said data bus for storage and evaluation in the central processing unit.

5. The apparatus of claim 4, wherein the binary signature signal generating circuit comprises:

a first circuit coupled to the probe and including means for stimulating the net in response to a feedback signal;

a second circuit coupled to the probe and also coupled to a hysteresis node, the second circuit including means for providing a signal indicative of a response of the net to the stimulation provided by the first circuit, the second circuit operating responsively to a voltage at the hysteresis node and the response of the net;

a third circuit coupled to the hysteresis node and to the feedback signal, the third circuit including means for forcing the hysteresis node to a high voltage, when the feedback signal has a first state, and for forcing the hysteresis node to a low voltage, when the feedback signal has a second state; and a fourth circuit coupled to the signal indicative of a response of the net, provided by the second circuit, and including means for providing the feedback signal such that the feedback signal has the first state, when the signal indicative of a response of the net has a lower value, and has the second state, when the signal indicative of a response of the net has a higher value, wherein the feedback signal is a signature signal pulse and the signature is formed by a train of feedback signals provided in a predetermined amount of time.

6. Apparatus for testing individual wiring nets in a multi-layer device carrier comprising:

at least one probe controlled by a central processing unit to engage contact pads on the multi-layer device carrier, each of said pads being electrically connected to a respective one of the wiring nets;

a binary signature signal generating circuit electrically coupled to the probe and effective while the probe is in engagement with a predetermined one of said contact pads to generate a train of pulses having a frequency uniquely characteristic of the predetermined wiring net to which the contact pad is connected;

a pulse counting circuit coupled to the signal generating circuit and controlled by said central processing unit for counting the number of pulses in said train of pulses which are received during a predetermined period of time and for storing a count value for the counted number of pulses; and means for transferring the count value to the central processing unit for evaluation.

7. Pulse counting apparatus comprising:

a programmable array logic (PAL) device configured as an n-state gray code state machine;

a source of clock signals applied to the PAL to repetitively sequence the PAL through its n states;

data output latches;

a pulse counter coupled to a source of pulses to be counted;

said PAL effective in one state for resetting the counter to zero, in subsequent second states for rendering the counter effective for counting pulses applied thereto during a predetermined period of time, and in subsequent third states for gating a count value from the pulse counter to the data output latches and for producing an output data valid signal;

a central processing unit (CPU) having a data bus coupled to the data output latches and to a data valid output of the PAL and having an address bus and selected control bus lines coupled to inputs of the PAL;

said PAL responsive to first address signals on the address bus and control signals on the selected control bus lines for resetting the PAL to said one state for initiating counting of said pulses as the PAL is subsequently stepped through said n states by the clock signals;

said PAL thereafter responsive to second address signals on the address bus and control signals on the selected control bus lines for producing an output enable signal, said output enable signal gating the count value in the data output latches and the data valid signal to the CPU data bus for storage and evaluation.

8. The apparatus of claim 7, wherein the source of clock signals includes a programmable frequency divider.

9. Pulse counting apparatus comprising:

a pulse counter coupled to a source of pulses to be counted;

programmable circuit means for rendering the pulse counter effective for counting pulses during any selected one of a number of predetermined time periods and including means for storing values corresponding to the number of pulses counted during a selected predetermined time period;

said circuit means producing a data valid signal on an output line thereof subsequent to storing each value; and a central processing unit having an address bus and control bus lines coupled to inputs to the programmable circuit means and a data bus coupled to the value storing means and the data valid output line for transferring count values to the data bus under the control of the central processing unit.

* * * * *